(12) United States Patent
Hung et al.

(10) Patent No.: US 11,594,511 B2
(45) Date of Patent: Feb. 28, 2023

(54) BONDING DEVICE AND BONDING METHOD

(71) Applicant: Advanced Semiconductor Engineering, Inc., Kaohsiung (TW)

(72) Inventors: Chih-Cheng Hung, Kaohsiung (TW); Wei-Han Lai, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 48 days.

(21) Appl. No.: 17/225,828

(22) Filed: Apr. 8, 2021

(65) Prior Publication Data
US 2022/0328446 A1    Oct. 13, 2022

(51) Int. Cl.
*B23K 1/00* (2006.01)
*H01L 23/00* (2006.01)
*B23K 20/00* (2006.01)

(52) U.S. Cl.
CPC ............ *H01L 24/75* (2013.01); *B23K 1/0016* (2013.01); *B23K 20/00* (2013.01); *H01L 24/81* (2013.01); *H01L 2224/75983* (2013.01); *H01L 2224/81203* (2013.01)

(58) Field of Classification Search
CPC ................. H01L 24/75; H01L 24/81; H01L 2224/75983; H01L 2224/81203; B23K 1/0016; B23K 20/00–04
USPC .................... 228/179.1–180.22, 6.2
See application file for complete search history.

(56) References Cited

U.S. PATENT DOCUMENTS

| | | | | |
|---|---|---|---|---|
| 3,887,783 | A | * | 6/1975 | Cornette ........... H01L 21/67144 228/6.2 |
| 3,941,297 | A | * | 3/1976 | Burns .................. B23K 20/023 228/179.1 |
| 2008/0073792 | A1 | * | 3/2008 | Hosseini ................. H01L 24/03 438/106 |
| 2016/0086830 | A1 | * | 3/2016 | Cheung ................. H01L 24/743 156/578 |
| 2017/0179071 | A1 | * | 6/2017 | Arvin ....................... H01L 24/81 |
| 2020/0006219 | A1 | * | 1/2020 | Chen ................... H01L 23/5226 |

* cited by examiner

*Primary Examiner* — Kiley S Stoner
(74) *Attorney, Agent, or Firm* — Foley & Lardner LLP

(57) ABSTRACT

A bonding device for bonding an electronic element includes an engaging component. The engaging component has a first surface and a second surface opposite to the first surface. The engaging component includes a plurality of recesses at the second surface. The plurality of recesses are configured to cover a plurality of projections of an electronic element. The engaging component is coupled to a heating component.

13 Claims, 13 Drawing Sheets

BONDING DEVICE AND BONDING METHOD

1. TECHNICAL FIELD

The present disclosure relates to a bonding device, and to a bonding method.

2. DESCRIPTION OF THE RELATED ART

In semiconductor industry, it may be necessary to attach a component having features on two opposite surfaces to a substrate. In silicon photonics, it is possible to integrate an electronic die (E-die) with a photonic die (P-die). In contrast to the E-die which relies on electrons to transmit signals, the P-die utilizes photons as signals. In the fabrication of a silicon photonics product, an electronic die may be bonded to a photonic die, or a stack of an electronic die and a photonic die may be bonded to a substrate such as a circuit board. The bonding technique is crucial to the performance of the semiconductor product, such as the silicon photonics, especially when the upper surface of the component is not flat (i.e., including features thereon). Therefore, to achieve higher yield and better performance of the final product, the bonding technique needs to be improved.

SUMMARY

In some embodiments, a bonding device is provided for bonding an electronic element. The bonding device includes an engaging component having a first surface and a second surface opposite to the first surface. The engaging component includes a plurality of recesses at the second surface. The plurality of recesses are configured to cover a plurality of projections of an electronic element. The engaging component is coupled to a heating component.

In some embodiments, a bonding device is provided for bonding an electronic element. The bonding device includes an engaging component having a base portion and a peripheral portion. The base portion and the peripheral portion define a space for accommodating an electronic element. The engaging component is coupled to a heating component to transfer heat to the electronic element.

In some embodiments, a bonding method is provided. The bonding method includes the following operations. An electronic element having a first surface and a second surface opposite to the first surface is provided. The electronic element includes a plurality of projections on the first surface. The electronic element is disposed on a substrate. The second surface of the electronic element faces the substrate. Heat is provided by a bonding device to form bonding joints between the electronic element and the substrate. The bonding device includes an engaging component having a first surface and a second surface opposite to the first surface. The engaging component includes a plurality of recesses at the second surface, and the plurality of recesses cover respective ones of the plurality of projections of the electronic element.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
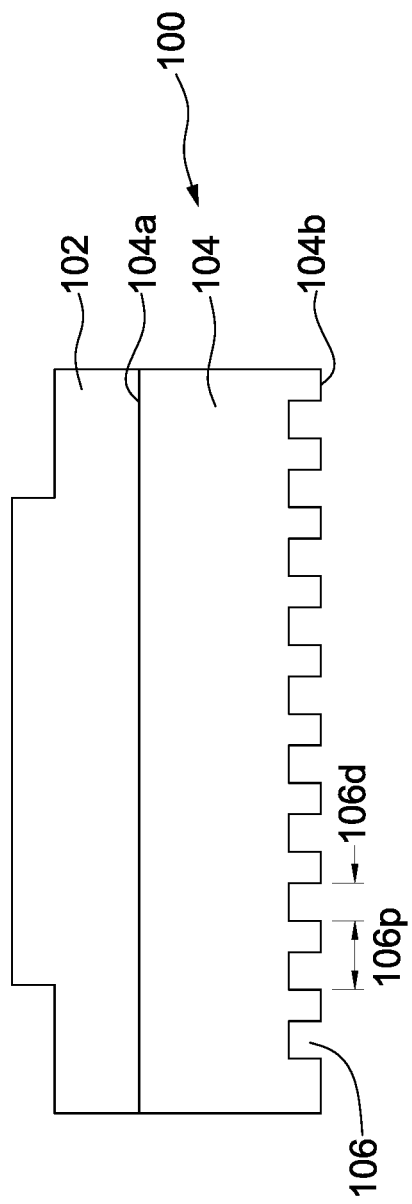
FIG. 1A illustrates a schematic cross-sectional view of a bonding device in accordance with some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In semiconductor industry, it may be necessary to bond an electronic element having features on two opposite surfaces with another electronic element or a substrate. For example, in some current silicon photonic products, a die (e.g., an electronic die "E-die") may be designed with a plurality of projections (e.g., pillars) disposed on two opposite surfaces. The E-die may suffer from warpage during its fabrication.

As a result, in the process of bonding the E-die to a photonic die (P-die) using a flip chip bonding technique and mass reflow, the bonding joints (e.g., solder joints) may not be well formed between the E-die and the P-die, leading to, for example, a solder non-wetting issue.

To address the above issue, a thermal compression (TC) bonding technique may be adopted to apply pressure to the E-die to mitigate or overcome warpage. In some comparative embodiments, a thermal compression (TC) bonding device having a two-dimensional planar heating surface is used to bond the electronic element having a plurality of projections disposed on two opposite surfaces of the electronic element to a substrate or to another electronic element (e.g., bonding an E-die having double-side pillars to a P-die). However, the planar heating surface of the TC bonding device can provide only a limited contact area for heat transfer with the electronic element having the plurality of projections since the planar surface of the TC bonding device can only be in contact with the projections of the electronic element. The limited contact area between the TC bonding device and the electronic element causes decreased heat transfer efficiency. Consequently, a connecting material (e.g., soldering material) on the surface of the electronic element opposite to the surface of the electronic element facing the TC bonding device may not reach the melting point during TC bonding, and formation of the bonding joints (e.g., solder joints) between the electronic element (e.g., the E-die) and the substrate or another electronic element (e.g., the P-die) may fail, leading to a low yield of the final products.

The present disclosure provides a TC bonding device with an engaging component (e.g., a tip). In some embodiments, the engaging component includes a plurality of recesses which are configured to cover a plurality of projections of an electronic element (e.g., the pillars of the E-die). In other words, the TC bonding device is designed with a three-dimensional non-planar heating surface. In some embodiments, the engaging component includes a peripheral portion disposed on and extending away from a surface of the engaging component to enclose the electronic element to be bonded. In some embodiments, the TC bonding device of the present disclosure allows for more contact area between the TC bonding device and the electronic element having the plurality of projections, based on the engaging component designed with the recesses. In some embodiments, the TC bonding device facilitates heat transfer from the TC bonding device to the electronic element by providing heat laterally from the peripheral portion. Consequently, the efficiency of heat transfer in a TC bonding process can be improved, and thereby the yield of the bonding joints can be increased.

FIG. 1A illustrates a schematic cross-sectional view of a bonding device 100 in accordance with some embodiments of the present disclosure. In some embodiments, the bonding device 100 is used to bond an electronic element having a plurality of projections (not shown in FIG. 1). The bonding device 100 includes an engaging component 104 having a first surface 104a and a second surface 104b opposite to the first surface 104a. The engaging component 104 includes a plurality of recesses 106 at the second surface 104b. The plurality of recesses 106 have a pitch 106p and a size 106d (such as a width or a diameter). The plurality of recesses 106 are configured to cover the plurality of projections of the electronic element. In some embodiments, a shape of the plurality of recesses 106 of the engaging component 104 is substantially identical to a shape of the plurality of projections of the electronic element. In some embodiments, the pitch 106p of the plurality of recesses 106 of the engaging component 104 is substantially identical to the pitch of the plurality of the projections of the electronic element. In some embodiments, the size 106d of the plurality of recesses of the engaging component is substantially identical to the size of the plurality of projections of the electronic element. In some embodiments, the size 106d of the plurality of recesses of the engaging component is larger than the size of the plurality of projections of the electronic element. The engaging component 104 is coupled to a heating component 102. In some embodiments, the heating component 102 is disposed on the first surface 104a of the engaging component 104. In some embodiments, the engaging component 104 includes a material such ceramics or tungsten steel (e.g., tungsten carbide), but the present disclosure is not limited thereto.

Figure 1C:
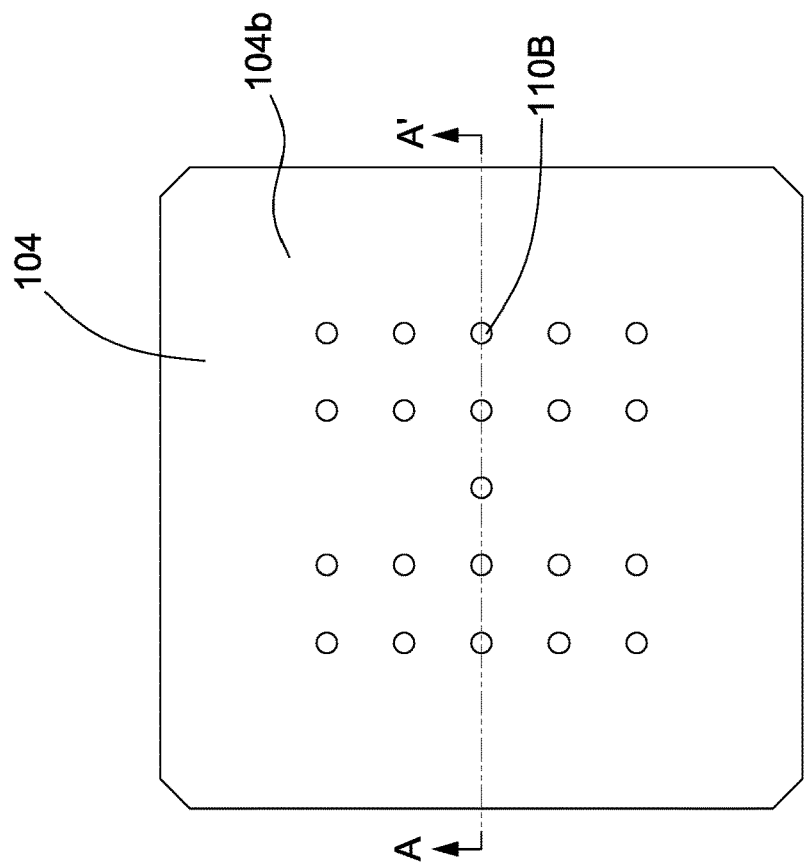
FIG. 1C illustrates a schematic bottom view of an engaging component of a bonding device in accordance with some embodiments of the present disclosure.
Figure 1B:
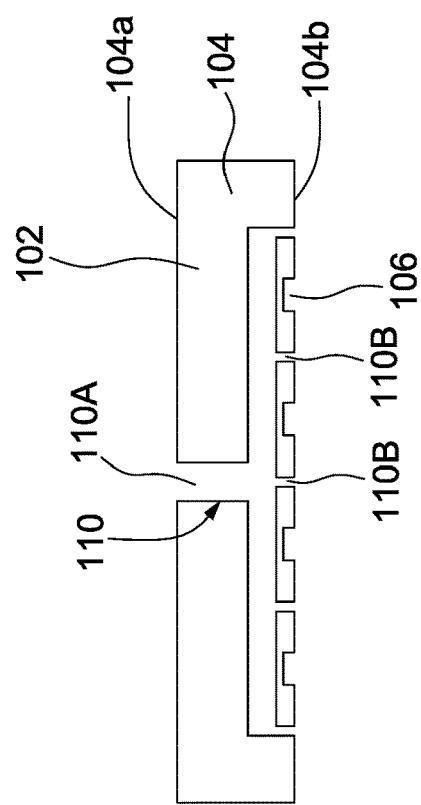
FIG. 1B illustrates a schematic cross-sectional view of an engaging component of a bonding device in accordance with some embodiments of the present disclosure.

FIG. 1B illustrates a schematic cross-sectional view of an engaging component 104 of a bonding device along line A-A' in FIG. 1C in accordance with some embodiments of the present disclosure. FIG. 1C illustrates a schematic bottom view of an engaging component 104 of a bonding device in accordance with some embodiments of the present disclosure. Referring to FIG. 1B, in some embodiments, the engaging component 104 includes a channel 110, in addition to the recesses 106 (not shown in FIG. 1C). In some embodiments, the channel 110 is disposed in the engaging component 104 for vacuum suction. In some embodiments, the channel 110 of the engaging component 104 includes a first sub-channel 110A at the first surface 104a of the engaging component 104. In some embodiments, the channel 110 of the engaging component 104 includes a plurality of second sub-channels 110B at the second surface 104b of the engaging component 104 as shown in FIG. 1B and FIG. 1C. In some embodiments, the first sub-channel 110A is in fluid communication with the plurality of the second sub-channels 110B. In some embodiments, the channel 110 includes one first sub-channel 110A at the center of the first surface 104a of the engaging component 104. In some embodiments, a width of the first sub-channel 110A is larger than a width of the second sub-channel 110B. The arrangements of the first sub-channel 110A and the plurality second sub-channels 110B in the engaging component 104 shown in FIG. 1B and FIG. 1C are merely for illustration. The position, number and/or shape of the first sub-channel 110A and the second sub-channel 110B may be modified according to practical requirements.

Figure 1D:
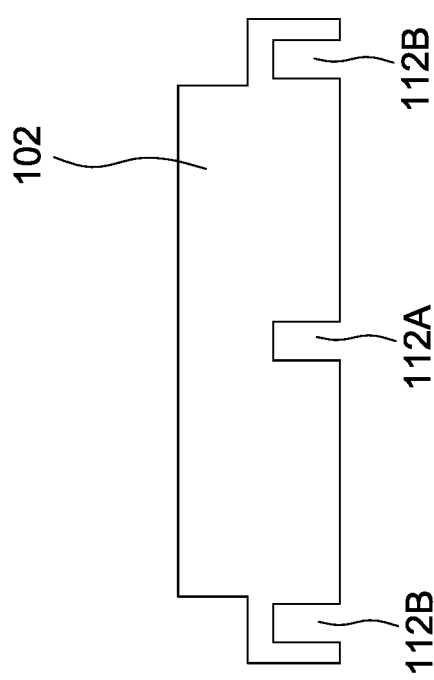
FIG. 1D illustrates a schematic cross-sectional view of a heating component of a bonding device in accordance with some embodiments of the present disclosure.
Figure 1E:
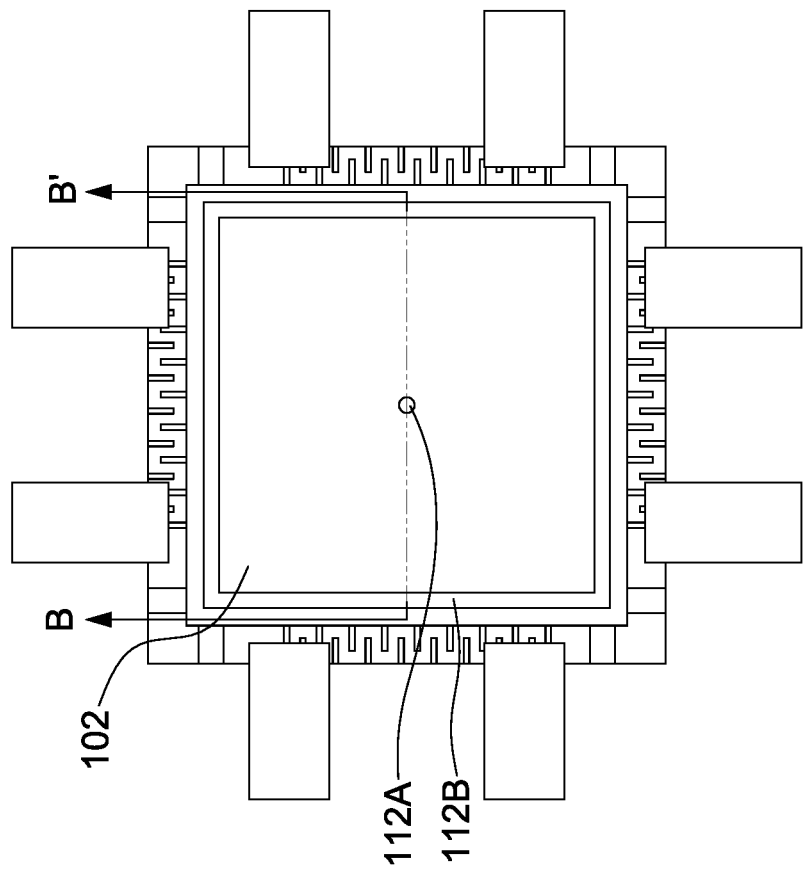
FIG. 1E illustrates a schematic bottom view of a heating component of a bonding device in accordance with some embodiments of the present disclosure.

FIG. 1D illustrates a schematic cross-sectional view of a heating component 102 of a bonding device along line B-B' in FIG. 1E in accordance with some embodiments of the present disclosure. FIG. 1E illustrates a schematic bottom view of a heating component 102 of a bonding device in accordance with some embodiments of the present disclosure. In some embodiments, the heating component 102 includes a channel structure, such as a first channel 112A and a second channel 112B as shown in FIG. 1D. In some embodiments, the channel structure is disposed in the heating component 102 for vacuum suction. In some embodiments as shown in FIG. 1D, the first channel 112A of the heating component 102 is arranged at the center of a bottom surface of the heating component 102. In some embodiments as shown in FIG. 1D and FIG. 1E, the second channel 112B of the heating component 102 is arranged on an edge of a bottom surface of the heating component 102. In some embodiments as shown in FIG. 1E, the second channel 112B of the heating component 102 surrounds the first channel 112A of the heating component 102. The arrangement of the first channel 112A and the second channel 112B in the heating component 102 shown in FIG. 1D and FIG. 1E are merely for illustration. The position, number and/or shape of the first channel 112A and the second channel 112B may be modified according to practical requirements.

In some embodiments, the engaging component 104 is coupled to the heating component 102 such that the first surface 104a of the engaging component 104 is in contact with a bottom surface of the heating component 102. In some embodiments, the engaging component 104 of FIG. 1B is coupled to the heating component 102 of FIG. 1D such that the channel 110 of the engaging component 104 is in fluid communication with the first channel 112A of the heating component 102. In some embodiments, the engaging component 104 of FIG. 1B is coupled to the heating component 102 of FIG. 1D such that the first sub-channel 110A of the engaging component 104 is in fluid communication with the first channel 112A of the heating component 102. In some embodiments, the engaging component 104 of FIG. 1B is coupled to the heating component 102 of FIG. 1D such that the second channel 112B of the heating component 102 contacts the first surface 104a of the engaging component 104. In some embodiments, the engaging component 104 of FIG. 1B is coupled to the heating component 102 of FIG. 1D by vacuum suction using the second channel 112B of the heating component 102.

Figure 2:
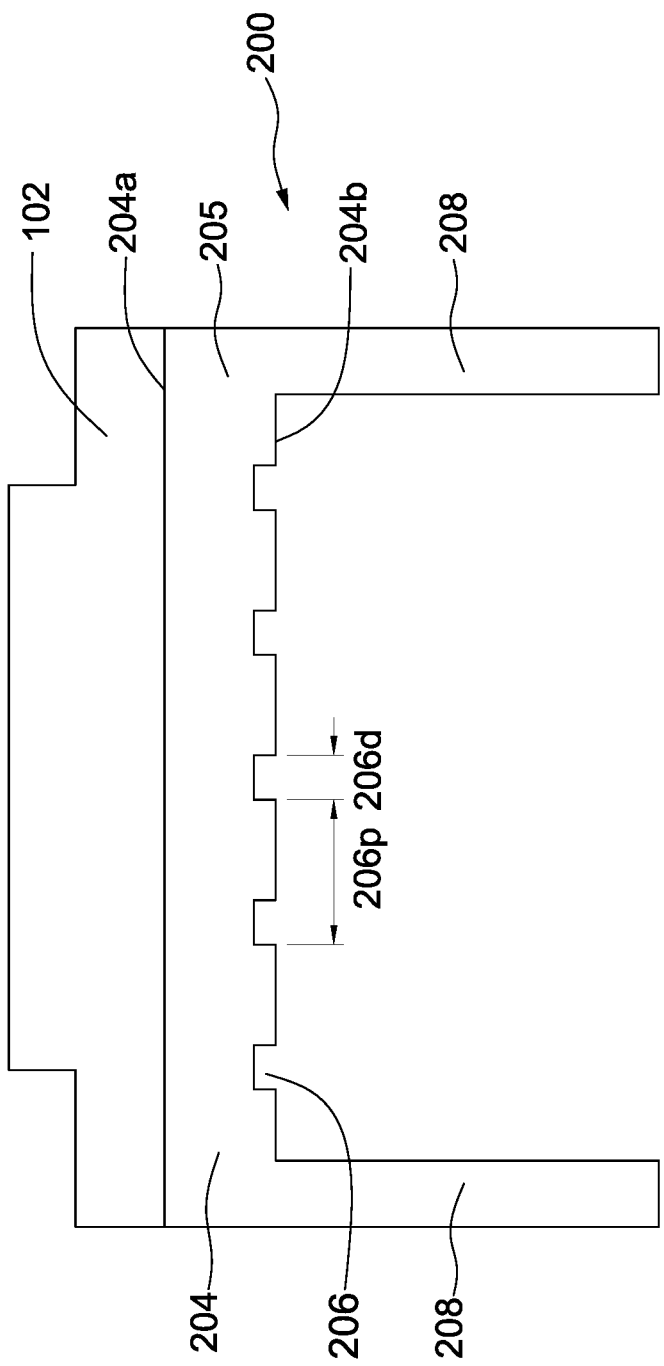
FIG. 2 illustrates a schematic cross-sectional view of a bonding device in accordance with some embodiments of the present disclosure.

FIG. 2 illustrates a schematic cross-sectional view of a bonding device 200 in accordance with some embodiments of the present disclosure. In some embodiments, the bonding device 200 is used to bond an electronic element having a plurality of projections. The bonding device 200 includes an engaging component 204 having a first surface 204a and a second surface 204b opposite to the first surface 204a. The engaging component 204 includes a plurality of recesses 206 at the second surface 204b. The plurality of recesses 206 have a pitch 206p and a size 206d (such as a width or a diameter). The plurality of recesses 206 are configured to cover the plurality of projections of the electronic element. The engaging component 204 is coupled to a heating component 102. The engaging component 204 further includes a peripheral portion 208 connected to an edge of the second surface 204b of the engaging component 204 and extending away from the first surface 204a of the engaging component 204. In some embodiments, the engaging component 204 includes a material such as ceramics or tungsten steel (e.g., tungsten carbide), but the present disclosure is not limited thereto.

In some embodiments as shown in FIG. 2, the bonding device 200 for bonding an electronic element includes an engaging component 204 having a base portion 205 and a peripheral portion 208. The base portion 205 and the peripheral portion 208 define a space for accommodating the electronic element. The engaging component 204 is coupled to a heating component 102 to transfer heat to the electronic element. In some embodiments, the base portion 205 has a first surface 204a and a second surface 204b opposite to the first surface 204a, and the peripheral portion 208 is connected to the second surface 204b of the base portion 205. In some embodiments, the peripheral portion 208 is connected to at least two opposite edges of the second surface 204b of the base portion 205. In some embodiments, the peripheral portion 208 surrounds a periphery of the second surface 204b of the base portion 205. In some embodiments, the engaging component 200 further includes a plurality of recesses 206 at the second surface 204b of the base portion 205.

Figure 3:
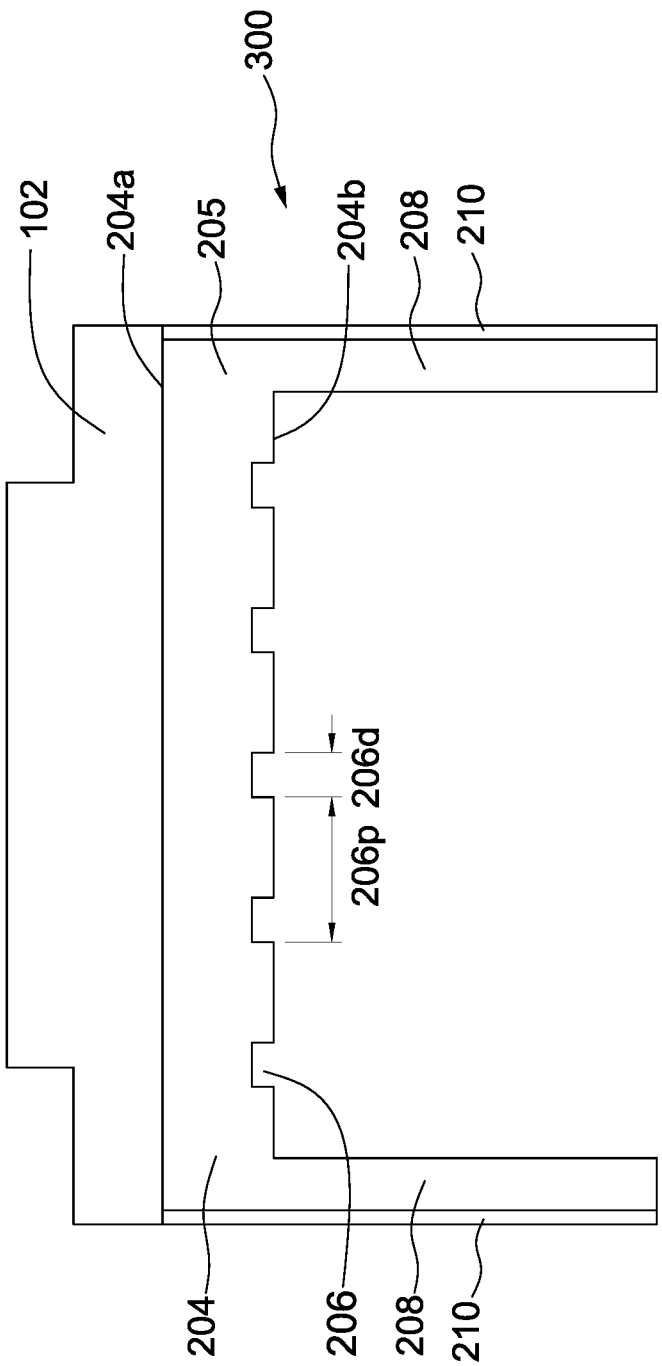
FIG. 3 illustrates a schematic cross-sectional view of a bonding device in accordance with some embodiments of the present disclosure.

FIG. 3 illustrates a schematic cross-sectional view of a bonding device 300 in accordance with some embodiments of the present disclosure. The bonding device 300 is similar to the bonding device 200 as described and illustrated with reference to FIG. 2, except that the bonding device 300 further includes a heat-insulating layer 210 on an outer surface of the peripheral portion 208 of the engaging component 204. In some embodiments, the heat-insulating layer 210 covers at least a portion of the outer surface of the peripheral portion 208 of the engaging component 204. In some embodiments, the heat-insulating layer 210 covers the whole outer surface of the peripheral portion 208 of the engaging component 204.

Figure 4A:
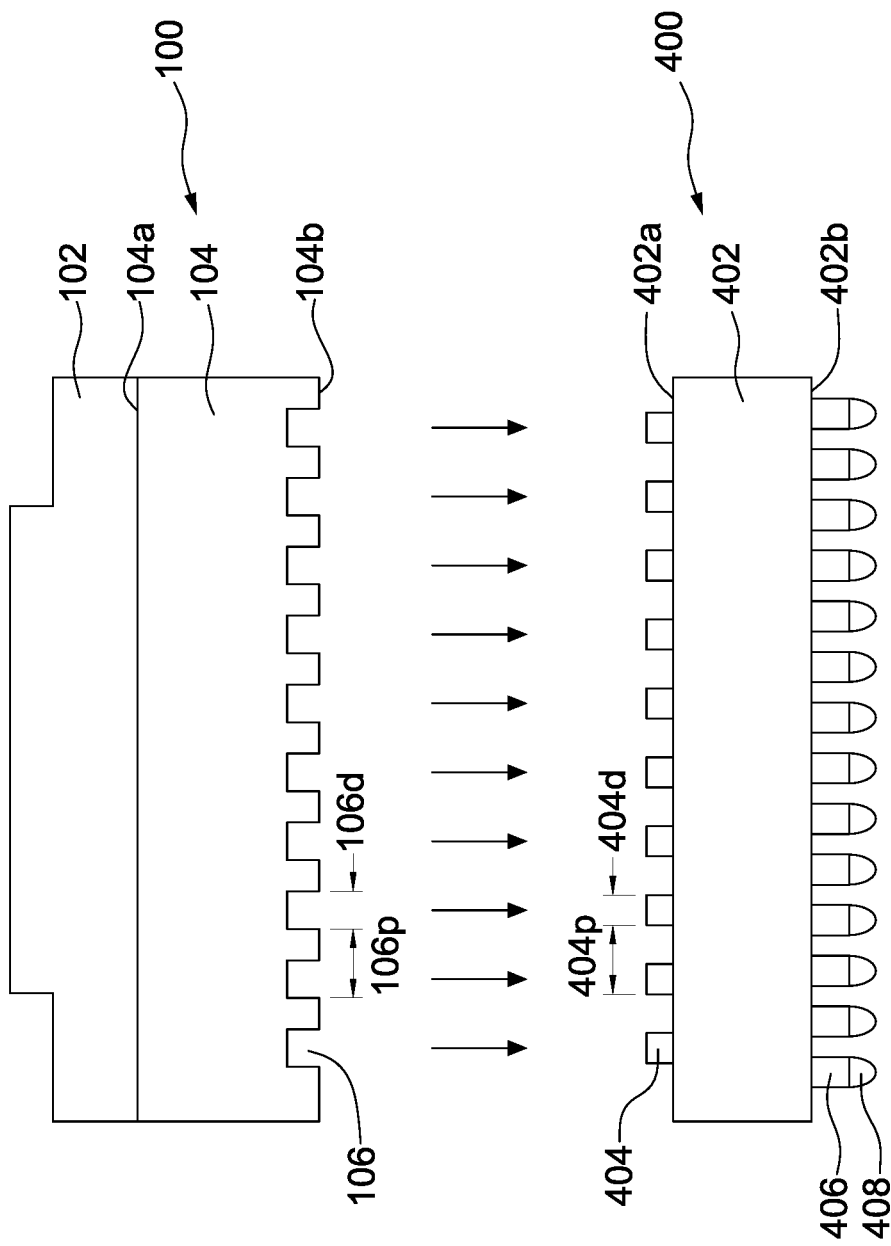
FIG. 4A and FIG. 4B illustrate one or more stages of a bonding method in accordance with some embodiments of the present disclosure.
Figure 4B:
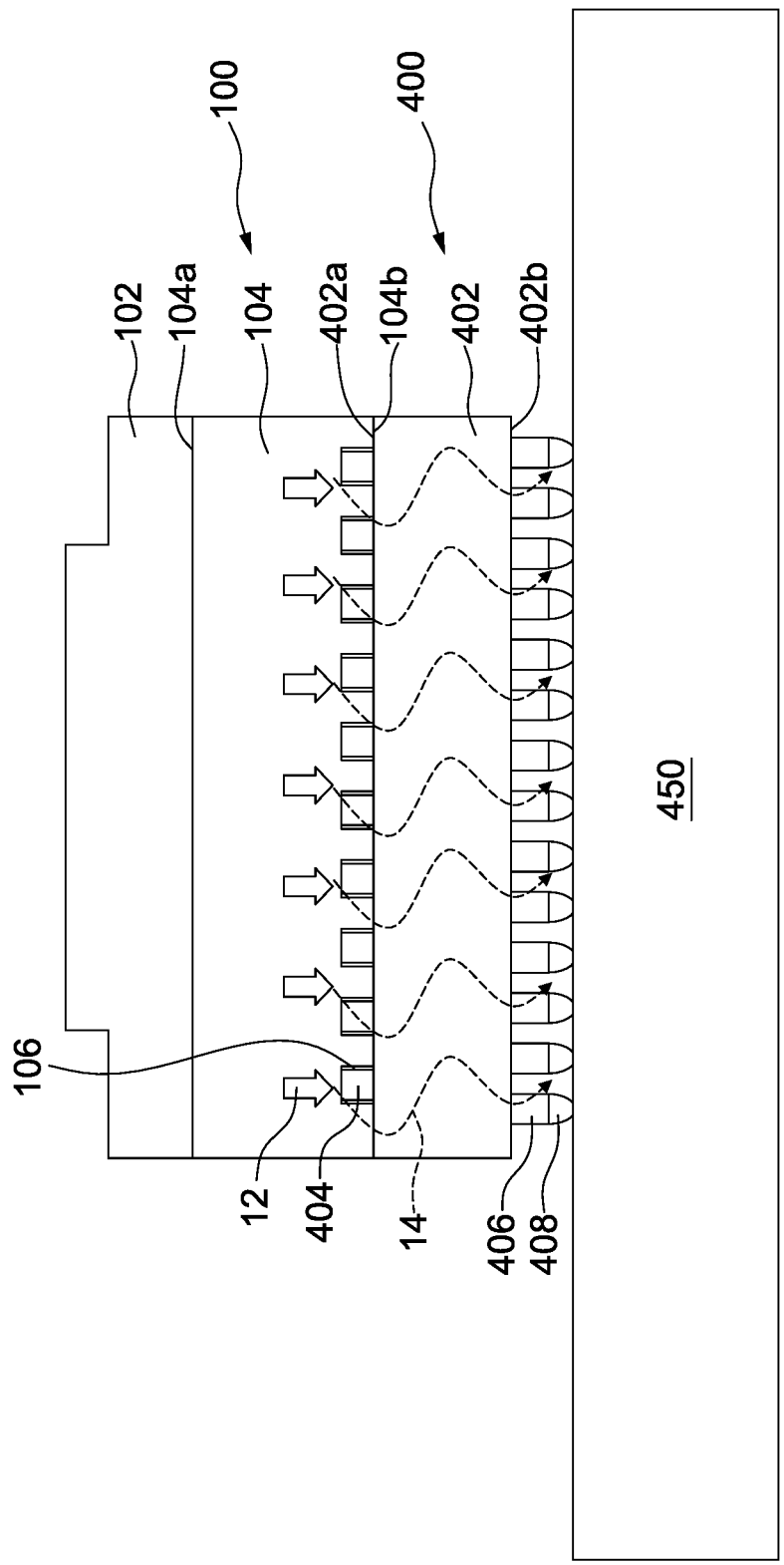

FIG. 4A and FIG. 4B illustrate one or more stages of a bonding method in accordance with some embodiments of the present disclosure. In some embodiments as shown in FIG. 4A, the bonding device 100 as described above and an electronic element 400 having a plurality of projections are provided. In some embodiments, the electronic element 400 may have a plurality of projections on an upper surface of the electronic element 400 and a plurality of projections on a lower surface of the electronic element 400. The electronic element may include a semiconductor substrate 402, such as a die. In some embodiments, the electronic element 400 includes a plurality of first projections 404 on the first surface 402a of the semiconductor substrate 402. In some embodiments, the electronic element 400 includes a plurality of second projections 406 on the second surface 402b of the semiconductor substrate 402. In some embodiments, the number, width and/or length of the first projections 404 is different from that of the second projections 406 as shown in FIG. 4A. In alternative embodiments, the number, width and/or length of the first projections 404 is substantially the same as that of the second projections 406. In some embodiments, the plurality of first projections 404 of the electronic element 400 have a pitch 404p and a size 404d, such as a width or a diameter. In some embodiments, the plurality of first projections 404 or the plurality of second projections 406 of the electronic element 400 may be made of conductive material or non-conductive material. In some embodiments, the plurality of first projections 404 or the plurality of second projections 406 of the electronic element 400 may be pads, bumps or conductive pillars, such as copper pillars. In some embodiments, a connecting material 408, such as a soldering material, is disposed on the plurality of second projections 406. In some other embodiments, the bonding method may be carried out without the presence of connecting material 408 and a direct bonding between the projections 406 of the electronic element 400 and the substrate 450 (e.g., pads of the substrate) may be formed.

As shown in FIG. 4A, in some embodiments, the plurality of recesses 106 of the engaging component 104 are configured to cover the plurality of first projections 404 of the electronic element 400. In some embodiments, a shape of the plurality of recesses 106 of the engaging component 104 is substantially identical to a shape of the plurality of first projections 404 of the electronic element 400. In some embodiments, the pitch 106p of the plurality of recesses 106 of the engaging component 104 is substantially identical to the pitch 404p of the plurality of first projections 404 of the electronic element 400. In some embodiments, the size 106d of the plurality of recesses 106 of the engaging component 104 is substantially identical to the size 404d of the plurality of first projections 404 of the electronic element 400. In some embodiments, the size 106d of the plurality of recesses 106 of the engaging component 104 is larger than the size 404d of the plurality of first projections 404 of the electronic element 400.

In some embodiments as shown in FIG. 4A, the bonding device 100 is aligned with the electronic element 400, i.e., the plurality of recesses 106 of the bonding device 100 are aligned with the respective ones of the plurality of first projections 404 of the electronic element 400. In some embodiments, the electronic element 400 is temporarily fixed to the bonding device 100, for example, by vacuum suction. In some embodiments, the vacuum suction is achieved by the channel 110 of the engaging component 104 and the first channel 112A of the heating component 102 as described above (also refer to FIG. 1B, FIG. 1C, FIG. 1D and FIG. 1E). In some embodiments, the recesses 106 of the engaging component 104 may contact the plurality of first projections 404 of the electronic element 400 (for example, the top walls of recesses 106 may contact the top surfaces of the plurality of first projections 404, and/or the lateral walls may contact the lateral surfaces of the plurality of first projections 404). In some embodiments as illustrated in FIG. 4B, the recesses 106 of the engaging component 104 may not fully contact the plurality of first projections 404 of the electronic element 400, i.e., there is space retained therebetween. In some embodiments, the second surface 104b of the bonding device 100 faces the first surface 402a of the electronic element 400. In some embodiments, the second surface 104b of the bonding device 100 contacts the first surface 402a of the electronic element 400 as illustrated in FIG. 4B. In some embodiments, the recesses 106 (i.e., the top walls of the recesses 106) of the bonding device 100 contact top surfaces of respective ones of the plurality of first projections 404 of the electronic element 400 as illustrated in FIG. 4B. In some embodiments, due to fabrication tolerance, a portion of the second surface 104b of the bonding device 100 may not contact the first surface 402a of the electronic element 400, and there may be space between said portion of the second surface 104b of the bonding device 100 and the first surface 402a of the electronic element 400. In some embodiments, due to fabrication tolerance, some of the recesses 106 of the bonding device 100 may not contact the top surfaces of respective ones of the plurality of first projections 404 of the electronic element 400, and there may be space between the top walls of these recesses 106 of the bonding device 100 and the top surfaces of respective ones of the plurality of first projections 404.

In some embodiments as shown in FIG. 4B, the electronic element 400 is disposed on or attached to a substrate 450 using the bonding device 100 such that the second surface 402b of the electronic element 400 faces the substrate 450 and the connecting material 408 contacts the substrate 450. Heat is provided by the bonding device 100 to form bonding joints, such as solder joints, between the electronic element 400 and the substrate 450. In some embodiments, the connecting material 408 is heated to a temperature above a melting point of the connecting material 408 by the bonding device 100 so as to form bonding joints, such as solder joints, between the electronic element 400 and the substrate 450. In some embodiments, the step of heating the electronic element 400 includes providing heat 14 from the second surface 104b of the engaging component 104 of the bonding device 100. In some embodiments, the heat 14 is transferred from the second surface 104b of the engaging component 104 of the bonding device 100 to the electronic element 400 by thermal conduction. In some embodiments, the heat 14 is transferred from the second surface 104b of the engaging component 104 of the bonding device 100 to the electronic element 400 by thermal conduction and convection. In some embodiments, the electronic element 400 is applied with pressure 12, for example, by the bonding device 100. In some embodiments, the step of heating the connecting material 408 is carried out under or accompanied by pressure 12. In some embodiments, the pressure 12 is applied to the electronic element 400 by the bonding device 100 to mitigate or overcome warpage of the electronic element 400. In some embodiments, the bonding device 100 applies the pressure 12 to the electronic element 400, followed by providing the heat 14 to the electronic element 400. In some embodiments, the bonding device 100 applies the pressure 12 to the electronic element 400 after or when providing the heat 14 to the electronic element 400.

As illustrated in FIG. 4B, the engaging component 104 is configured to transfer heat from the heating component 102 through the first surface 104a to the engaging component 104. In some embodiments, the engaging component 104 is configured to transfer heat 14 through the second surface 104b to the electronic element 400. In some embodiments, the heat 14 is received and transferred from the first surface 402a of the electronic element 400 to the connecting material 408 of the electronic element 400. In some embodiments, the second surface 104b of the engaging component 104 is configured to contact the first surface 402a of the electronic element 400. In some embodiments, the plurality of the recesses 106 of the bonding device 100 are configured such that inner walls of the plurality of the recesses 106 are in close proximity to or in contact with the first projections 404 of the electronic element 400.

As shown in FIG. 4B, the engaging component 104 of the bonding device 100 includes the plurality of recesses 106 for accommodation of the first projections 404 of the electronic element 400, allowing the bonding device 100 to have more area for heat transfer with the electronic element 400, thereby improving heat transfer efficiency in a TC bonding process. Consequently, the connecting material 408 of the electronic device 400 can be efficiently heated to above the melting point by the bonding device 100 to form bonding joints with the substrate 450, and thereby the yield of the final product can be increased.

In some embodiments, the semiconductor substrate 402 of the electronic element 400 is an E-die. The E-die has a plurality of projections or protrusions (e.g., the first projections 404) on an upper surface (e.g., the first surface 402a) and a plurality of projections or protrusions (e.g., the second projections 406) on a lower surface (e.g., the second surface 402b). Examples of the projections or protrusions include, but are not limited to, conductive pillars. In some embodiments, the E-die may suffer from warpage during its fabrication, and as a result, some of the projections on the lower surface (e.g., the second projections 406 on the second surface 402b) of the E-die may not contact the substrate 450. The bonding device 100 may apply a pressure 12 to mitigate or overcome the warpage, so that the projections or protrusions on the lower surface of the E-die can be in more contact with the substrate 450. Therefore, the yield of the bonding between the E-die and the substrate 450 can be improved. In some embodiments, the engaging component 104 of the bonding device 100 includes the plurality of recesses 106 for accommodation of the projections or protrusions of the E-die, allowing the bonding device 100 to have sufficient or more area for heat transfer with the E-die, so that heat 12 can be efficiently transferred to a connecting material (e.g. connecting material 408) on the E-die. Therefore, bonding joints can be efficiently formed between the E-die and the substrate 450, and the yield of the bonding between the E-die and the substrate 450 can be improved.

In some embodiments, the substrate 450 may be an electronic element, such as a die. In some embodiments, the substrate 450 may be an electronic die (E-die) or a photonic die (P-die). In some embodiments, the substrate 450 may be, for example, a printed circuit board, such as a paper-based copper foil laminate, a composite copper foil laminate, or a polymer-impregnated glass-fiber-based copper foil laminate, but the present disclosure is not limited thereto. The substrate 450 may include an interconnection structure (e.g., traces and vias) and/or a grounding element. In some embodiments, the substrate 450 may be a single-layer substrate or multi-layer substrate which includes a core layer and a conductive material and/or structure. The conductive material and/or structure may include a plurality of traces. The substrate 450 may include one or more conductive pads in proximity to, adjacent to, or embedded in and exposed at both surfaces (e.g., a top surface and a bottom surface) of the substrate 450. The substrate 450 may include a solder resist (or solder mask) on both surfaces of the substrate 450 and the conductive pads of the substrate 450 are exposed from the solder resist for electrical connections.

Figure 5A:
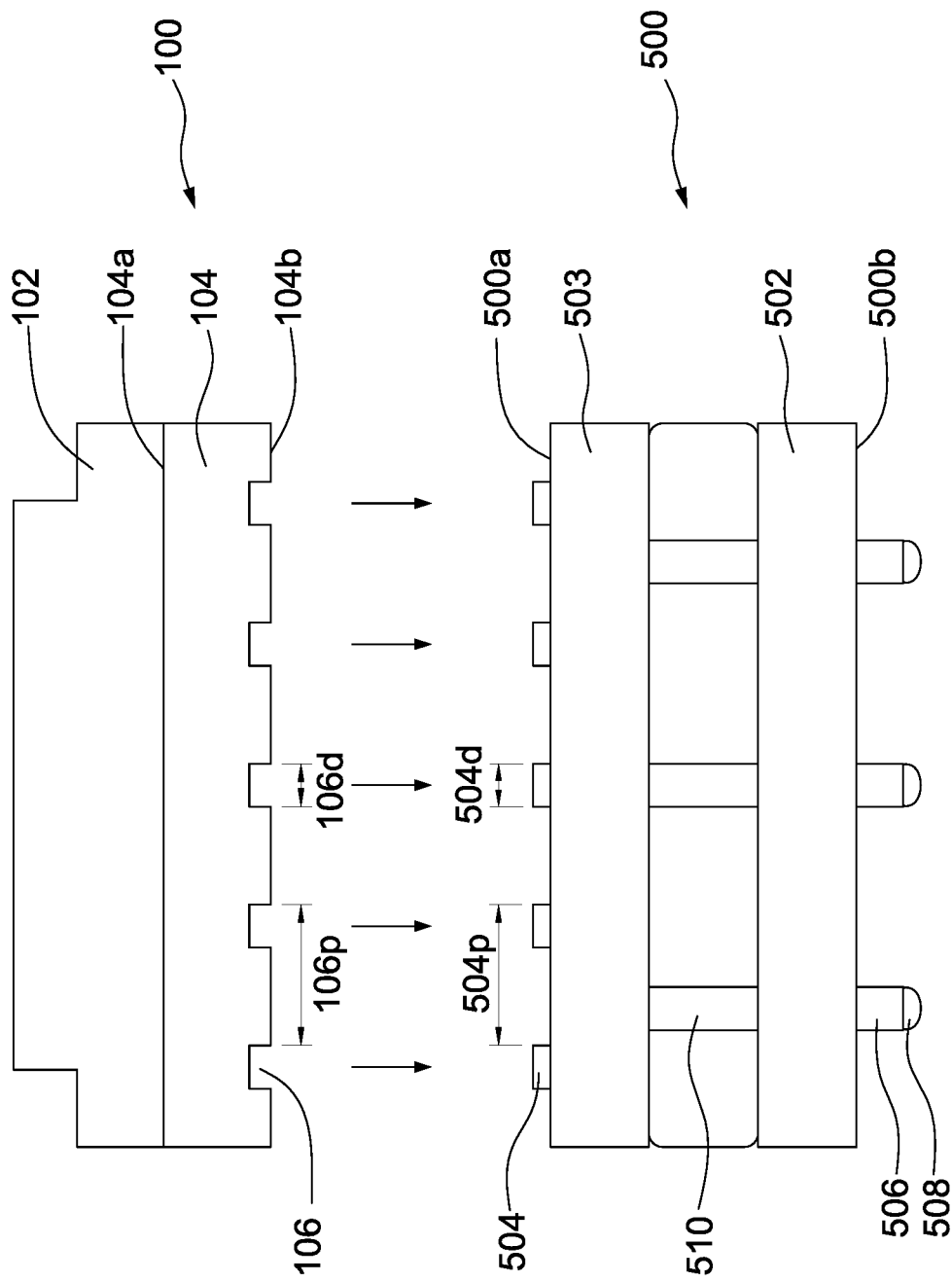
FIG. 5A and FIG. 5B illustrate one or more stages of a bonding method in accordance with some embodiments of the present disclosure.
Figure 5B:
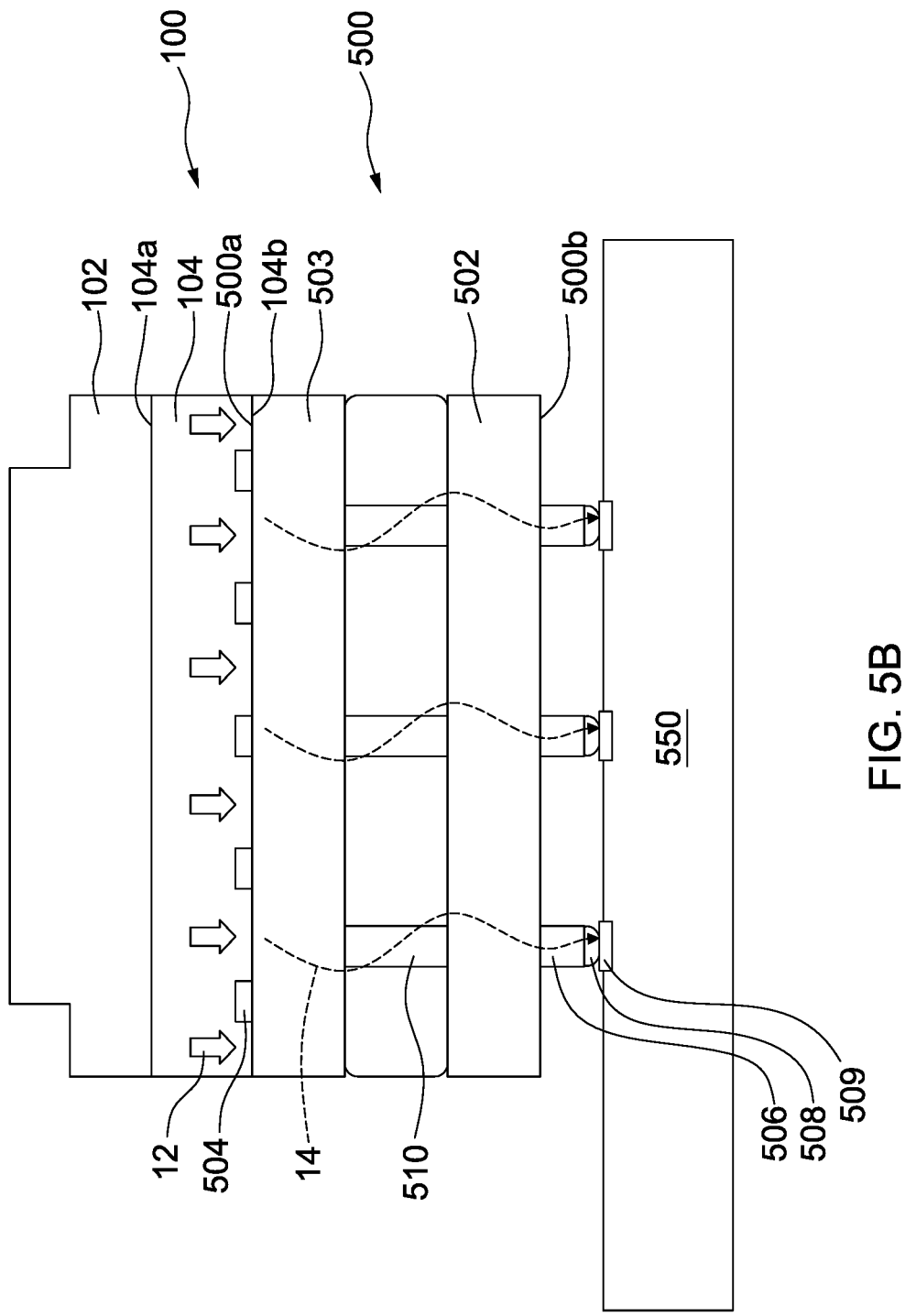

FIG. 5A and FIG. 5B illustrate one or more stages of a bonding method in accordance with some embodiments of the present disclosure. The bonding method illustrated in FIG. 5A and FIG. 5B is similar to the bonding method as described and illustrated with reference to FIG. 4A and FIG. 4B, except that an electronic element 500 is provided. The electronic element 500 has a first surface 500a and a second surface 500b opposite to the first surface 500a. In some embodiments, the electronic element 500 includes a plurality of first projections 504 on the first surface 500a. In some embodiments, the electronic element 500 includes a plurality of second projections 506 on the second surface 500b. In some embodiments, the number, width and/or length of the first projections 504 is different from that of the second projections 506 as shown in FIG. 5A. In alternative embodiments, the number, width and/or length of the first projections 404 is substantially the same as that of the second projections 506. In some embodiments, the plurality of first projections 504 of the electronic element 500 have a pitch 504p and a size 504d, such as a width or a diameter. In some embodiments, the plurality of first projections 504 or the plurality of first projections 506 of the electronic element 400 may be made of conductive material or non-conductive material. In some embodiments, the plurality of first projections 504 or the plurality of first projections 506 of the electronic element 500 may be pads, bumps or conductive pillars, such as copper pillars. In some embodiments, a connecting material 508, such as a soldering material, is disposed on the plurality of second projections 506.

In some embodiments, the electronic element 500 includes a stack of electronic elements. In some embodiments, the electronic element 500 includes a stack of a first die 502 and a second die 503. In some embodiments, the first die 502 is electrically connected to the second die 503 by interconnects 510. The interconnects 510 may be formed within or surrounded by a dielectric material or an insulating material. In some embodiments, the first die 502 is an electronic die, and the second die 504 is a photonic die. In alternative embodiments, the first die 502 is a photonic die, and the second die 504 is an electronic die.

As shown in FIG. 5A, in some embodiments, the plurality of recesses 106 are configured to cover the plurality of first projections 504 of the electronic element 500. In some embodiments, a shape of the plurality of recesses 106 of the engaging component 104 is substantially identical to a shape of the plurality of first projections 504 of the electronic element 500. In some embodiments, the pitch 106p of the plurality of recesses 106 is substantially identical to the pitch 504p of the plurality of first projections 504 of the electronic element 500. In some embodiments, the size 106d of the plurality of recesses 106 is substantially identical to the size 504d of the plurality of first projections 504 of the electronic element 500. In some embodiments, the size 106d of the plurality of recesses 106 is larger than the size 504d of the plurality of first projections 504 of the electronic element 500.

In some embodiments as shown in FIG. 5A, the bonding device 100 is aligned with the electronic element 500, i.e., the plurality of recesses 106 of the bonding device 100 are aligned with the respective ones of the plurality of first projections 504 of the electronic element 500. In some embodiments, the second surface 104b of the bonding device 100 faces the first surface 500a of the electronic element 500. In some embodiments, the recesses 106 of the engaging component 104 may contact the plurality of first projections 504 of the electronic element 500. In some embodiments, the recesses 106 of the engaging component 104 may not fully contact the plurality of first projections 504 of the electronic element 500, i.e., there is space retained therebetween. In some embodiments, the electronic element 500 is temporarily fixed to the bonding device 100, for example, by vacuum suction. In some embodiments, the vacuum suction is achieved by the channel 110 of the engaging component 104 and the first channel 112A of the heating component 102 as described above (also refer to FIG. 1B, FIG. 1C, FIG. 1D and FIG. 1E).

In some embodiments as shown in FIG. 5B, the electronic element 500 is disposed on or attached to a substrate 550 using the bonding device 100 such that the second surface 500b of the electronic element 500 faces the substrate 550 and the connecting material 508 contacts the substrate 550. The connecting material 508 is heated to a temperature above a melting point of the connecting material by the bonding device 100 so as to form bonding joints, such as solder joints, between the electronic element 500 and the substrate 550. In some embodiments, the step of heating the connecting material includes providing heat 14 from the second surface 104b of the engaging component 104 of the bonding device 100. In some embodiments, the heat 14 is transferred from the second surface 104b of the engaging component 104 of the bonding device 100 to the electronic element 500 by thermal conduction. In some embodiments, the heat 14 is transferred from the second surface 104b of the engaging component 104 of the bonding device 100 to the electronic element 500 by thermal conduction and convection. In some embodiments, the step of heating the connecting material 408 is carried out under or accompanied by pressure 12. In some embodiments, the pressure 12 is applied to the electronic element 500 by the bonding device 100 to mitigate or overcome warpage of the electronic element 500. In some embodiments, the bonding device 100 applies the pressure 12 to the electronic element 500, followed by providing the heat 14 to the electronic element 500. In some embodiments, the bonding device 100 applies the pressure 12 to the electronic element 500 after providing the heat 14 to the electronic element 500.

As illustrated in FIG. 5B, the engaging component 104 is configured to transfer heat from the heating component 102 through the first surface 104a to the engaging component 104. In some embodiments, the engaging component 104 is configured to transfer heat 14 through the second surface 104b to the electronic element 500. In some embodiments, the heat 14 is received and transferred from the first surface 500a of the electronic element 500 to the connecting material 508 of the electronic element 500. In some embodiments, the second surface 104b of the engaging component 104 is configured to contact the first surface 500a of the electronic element 500. In some embodiments, the plurality of the recesses 106 of the bonding device 100 are configured such that inner walls of the plurality of the recesses 106 are in close proximity to or in contact with the first projections 504 of the electronic element 500.

In some embodiments, the substrate 550 may be, for example, a printed circuit board, such as a paper-based copper foil laminate, a composite copper foil laminate, or a polymer-impregnated glass-fiber-based copper foil laminate, but the present disclosure is not limited thereto. The substrate 550 may include an interconnection structure (e.g., traces and vias) and/or a grounding element. In some embodiments, the substrate 550 may be a single-layer substrate or multi-layer substrate which includes a core layer and a conductive material and/or structure. The conductive material and/or structure may include a plurality of traces. The substrate 550 may include one or more conductive pads 509 in proximity to, adjacent to, or embedded in and exposed at both surfaces (e.g., a top surface and a bottom surface) of the substrate 550. The substrate 550 may include a solder resist (or solder mask) on both surfaces of the substrate 550 and the conductive pads 509 of the substrate 550 are exposed from the solder resist for electrical connections. In some embodiment, the substrate 550 may be an electronic element, such as a die. In some embodiments, the substrate 450 may be an electronic die (E-die) or a photonic die (P-die).

Figure 6A:
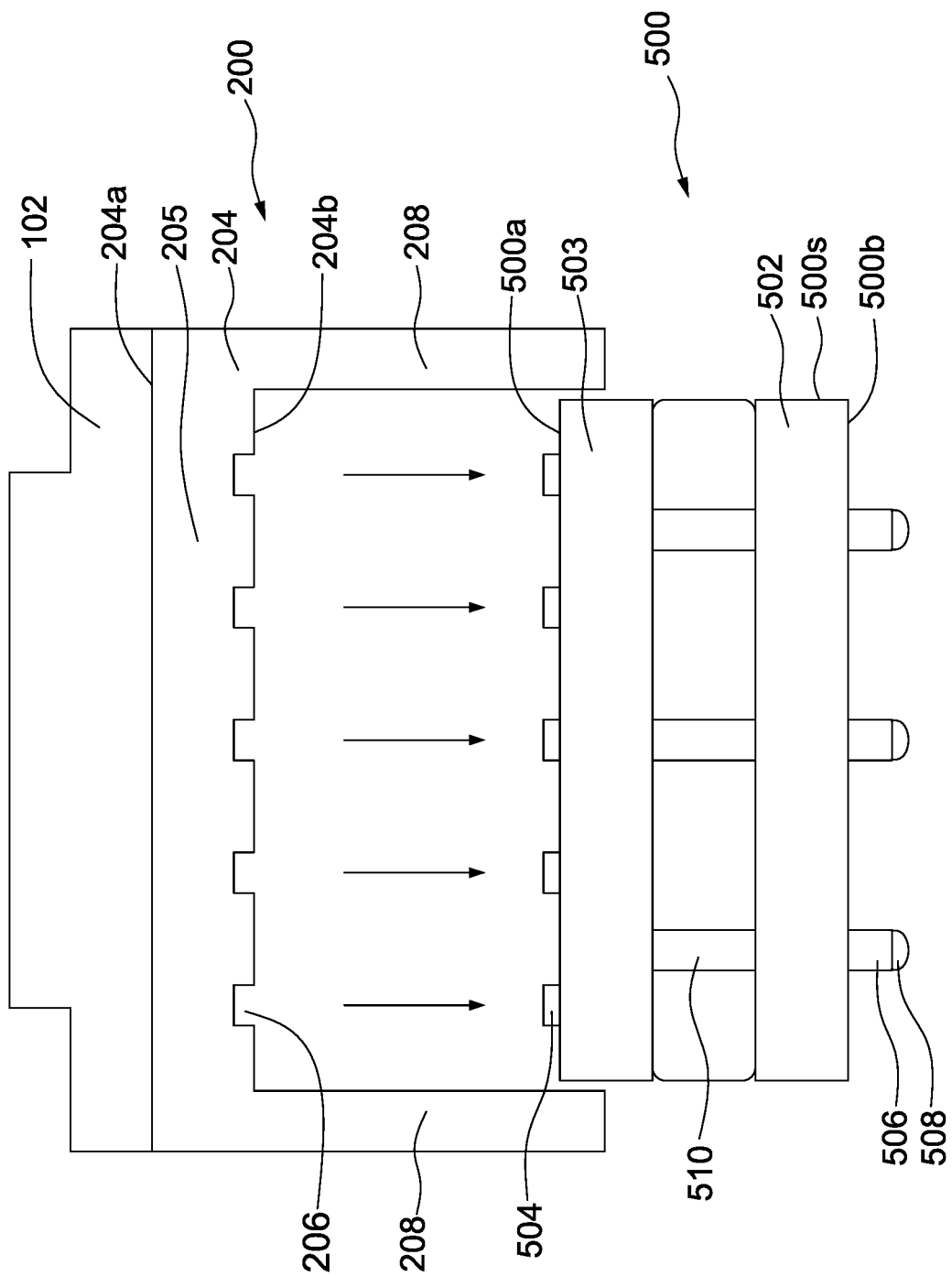
FIG. 6A and FIG. 6B illustrate one or more stages of a bonding method in accordance with some embodiments of the present disclosure.
Figure 6B:
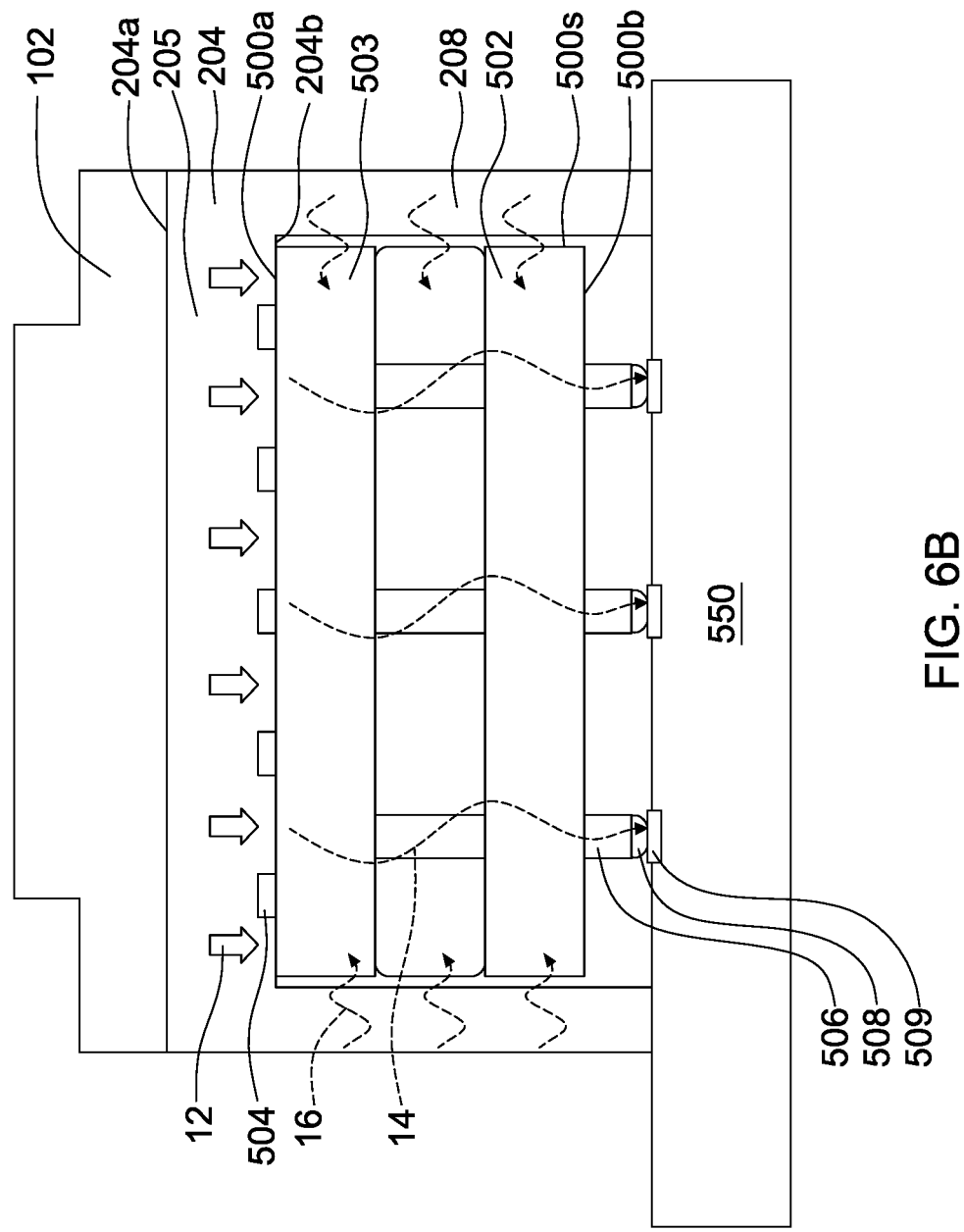

FIG. 6A and FIG. 6B illustrate one or more stages of a bonding method in accordance with some embodiments of the present disclosure. The bonding method illustrated in FIG. 6A and FIG. 6B is similar to the bonding method as described and illustrated with reference to FIG. 5A and FIG. 5B, except that a bonding device 200 as described above is provided. In some embodiments, when the bonding device 200 is used to bond the electronic element 500 to the substrate 550, an inner surface of the peripheral portion 208 of the engaging component 204 is adjacent to a lateral surface 500s of the electronic element 500. In some embodiments, when the bonding device 200 is used to bond the electronic element 500 to the substrate 550, the base portion 205 and the peripheral portion 208 of the engaging component 204 of the bonding device 200 enclose the electronic device 500 to be disposed on or attached to the substrate 550. In addition to transferring heat 14 from the heating component 102 through the base portion 205 of the engaging component 204 to the electronic component 500, the engaging component 204 may transfer heat 16 from the heating component 102 through the peripheral portion 208 to the lateral surface 500s of the electronic element 500. In some embodiments, the engaging component 204 is configured to transfer heat 14 vertically to the electronic element 500 by the base portion 205, and transfer heat 16 laterally to the electronic element 500 by the peripheral portion 208. In some embodiments, the engaging component 204 is configured to transfer heat 14 from the base portion 205 to the electronic element 500 by conduction or by conduction in combination with convection. In some embodiments, the engaging component 204 is configured to transfer heat 16 from the peripheral part 208 to the electronic element 500 by convection. In some embodiments, the presence of the peripheral part 208 may reduce heat dissipation from the lateral surface 500s of the electronic element 500.

As illustrated in FIG. 6B, the peripheral portion 208 of the engaging component 204 provides lateral paths for heat transfer to the electronic component 500 or it may function as a thermal barrier to avoid heat dissipation from the lateral surface 500s of the electronic element 500 to the environment, thereby enhancing heat transfer efficiency. Consequently, the connecting material 508 of the electronic device 500 can be more efficiently heated to above the melting point by the bonding device 200 to form bonding joints with the substrate 550, and thereby the yield of the final product can be increased.

Figure 7A:
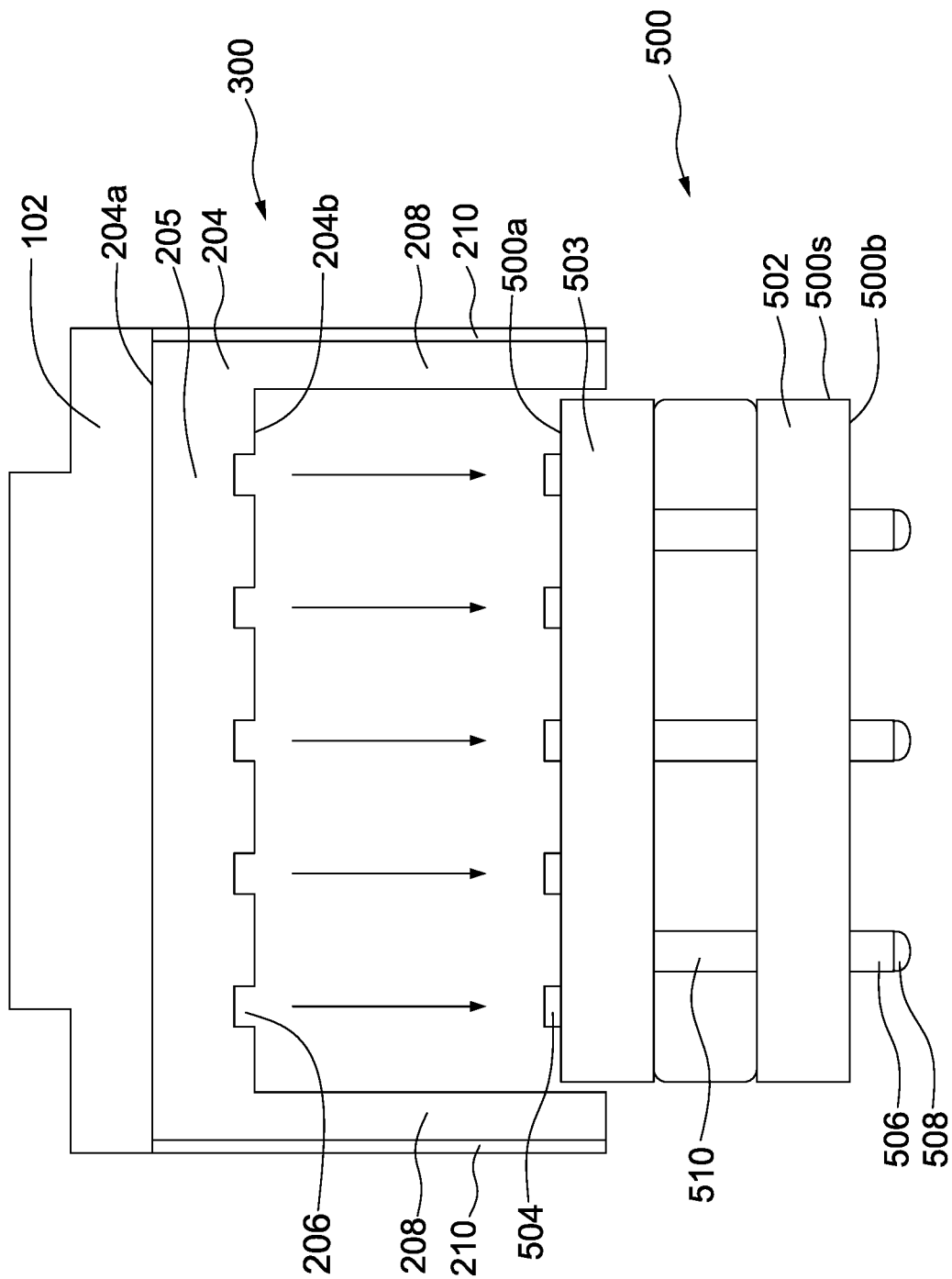
FIG. 7A and FIG. 7B illustrate one or more stages of a bonding method in accordance with some embodiments of the present disclosure.
Figure 7B:
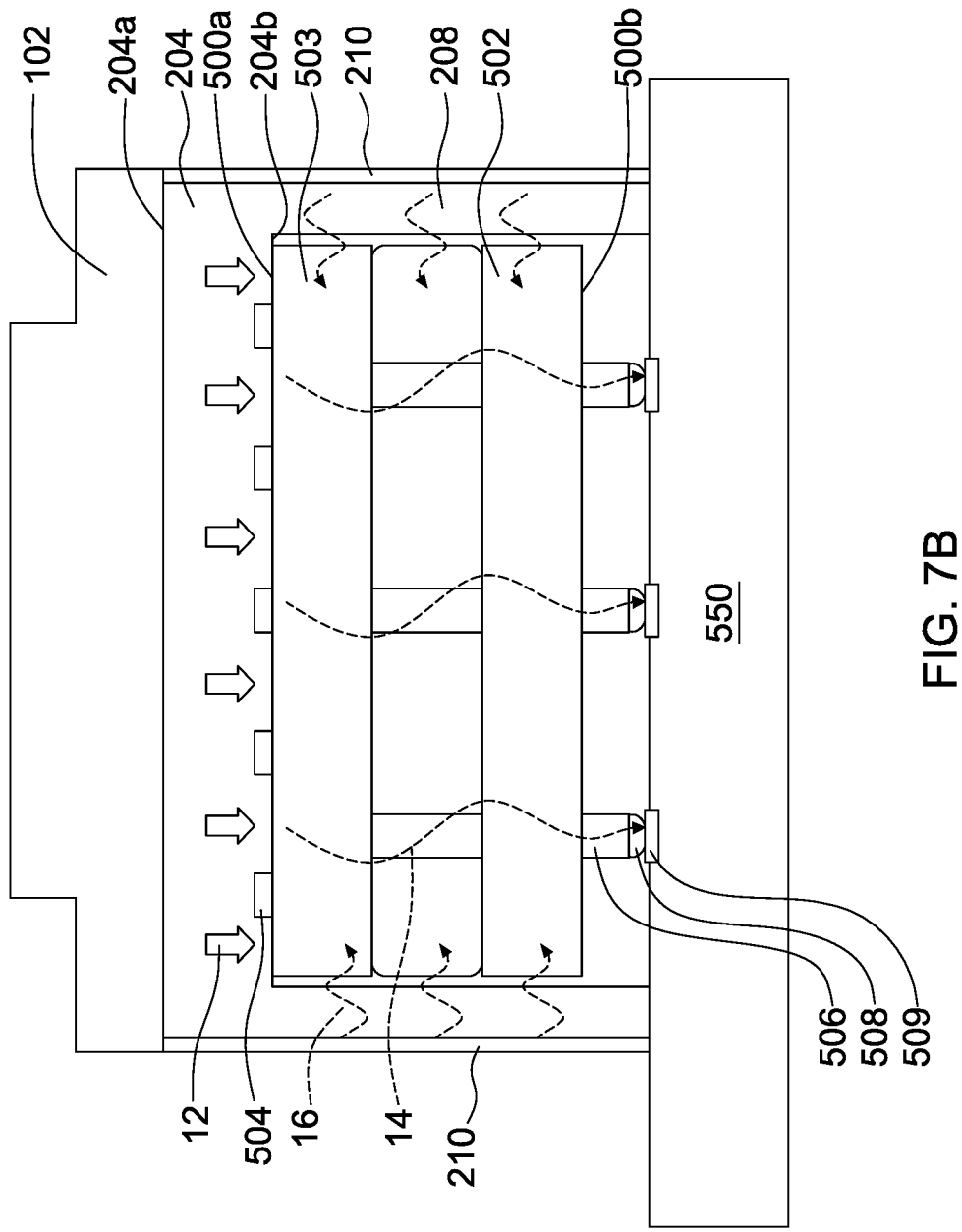

FIG. 7A and FIG. 7B illustrate one or more stages of a bonding method in accordance with some embodiments of the present disclosure. The bonding method illustrated in FIG. 7A and FIG. 7B is similar to the bonding method as described and illustrated with reference to FIG. 6A and FIG. 6B, except that a bonding device 300 as described above is provided. For the bonding device 300, the engaging component 204 further includes a heat-insulating layer 210 on an outer surface of the peripheral portion 208. The heat-insulating layer 210 forms a heat barrier to hinder or prevent heat from dissipating to the environment, thereby further enhancing the efficiency of heat transfer to the electronic element 500.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of the embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

As used herein, the singular terms "a," "an," and "the" may include plural referents unless the context clearly dictates otherwise.

While the present disclosure has been described and illustrated with reference to specific embodiments thereof, these descriptions and illustrations are not limiting. It should be understood by those skilled in the art that various changes may be made, and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A bonding method, comprising:
providing an electronic element having a first surface and a second surface opposite to the first surface, wherein the electronic element comprises a plurality of projections on the first surface;
disposing the electronic element on a substrate, wherein the second surface of the electronic element faces the substrate; and
providing heat by a bonding device to form bonding joints between the electronic element and the substrate,
wherein the bonding device comprises an engaging component having a first surface and a second surface opposite to the first surface, the engaging component comprises a plurality of recesses at the second surface and the plurality of recesses cover respective ones of the plurality of projections of the electronic element.

2. The bonding method of claim 1, wherein the second surface of the electronic element comprises conductive pillars and the conductive pillars contact a soldering material.

3. The bonding method of claim 1, wherein the electronic element comprises a stack of a first die and a second die.

4. The bonding method of claim 3, wherein the first die is electrically connected to the second die by interconnects.

5. The bonding method of claim 1, wherein the electronic element is an electronic die, and the substrate is a photonic die.

6. The bonding method of claim 1, wherein the electronic element comprises a stack of an electronic die and a photonic die.

7. The bonding method of claim 1, wherein the step of providing heat comprises providing heat from the second surface of the engaging component of the bonding device.

8. The bonding method of claim 1, wherein the second surface of the electronic element is connected to the substrate via a soldering material, and the step of providing heat comprises heating the soldering material to a temperature above a melting temperature of the soldering material.

9. The bonding method of claim 1, further comprising applying a pressure to the electronic element.

10. The bonding method of claim 1, further comprising temporarily fixing the electronic element to the bonding device before placing the electronic element on the substrate.

11. The bonding method of claim 10, wherein the electronic element is temporarily fixed to the bonding device by vacuum suction.

12. The bonding method of claim 1, wherein the plurality of recesses of the engaging component are separated from each other.

13. The bonding method of claim 9, wherein the step of the applying a pressure is configured to suppress a warpage of the electronic element.

* * * * *